United States Patent [19]

King et al.

[11] Patent Number: 5,283,518
[45] Date of Patent: Feb. 1, 1994

[54] METHOD FOR THE CONTROL OF GROUND BOUNCE BELOW AN INTERNAL GROUND PLANE IN A SHORT-WIRE BOARD TEST FIXTURE

[75] Inventors: Philip N. King, Fort Collins; T. Risselle Richert, Loveland, both of Colo.

[73] Assignee: Hewlett-Packard Company, Palo Alto, Calif.

[21] Appl. No.: 43,621

[22] Filed: Apr. 7, 1993

Related U.S. Application Data

[63] Continuation of Ser. No. 761,540, Sep. 18, 1991, abandoned.

[51] Int. Cl.[5] .................... G01R 1/073; G01R 31/02
[52] U.S. Cl. .......................... 324/158 P; 324/158 F
[58] Field of Search ............ 324/158 R, 158 P, 158 F, 324/73.1; 29/825, 832, 834, 842; 364/488

[56] References Cited

U.S. PATENT DOCUMENTS

| | | | |
|---|---|---|---|
| 4,116,523 | 9/1978 | Coberly et al. | 324/158 P |
| 4,740,746 | 4/1988 | Pollock et al. | 324/158 F |

Primary Examiner—Ernest F. Karlsen

[57] ABSTRACT

Algorithms are set forth for positioning critical test signal pins in a short-wire board test fixture so as to efficiently minimize ground bounce. The board test fixture interfaces a test system to a circuit board under test. Critical signals are those signals susceptible to ground bounce. The test signal pins connect a ground plane in the board test fixture to pin cards interfaced to the board test system. Each pin card has a first column of test signal pins and a set of first ground pins. Moreover, each pin card has a second column comprising a set of second ground pins. In order to minimize ground bounce, no more than fifteen second ground pins per pin card are inactive. No more than two consecutive second ground pins per pin card are inactive. Any critical test signals are assigned within three pins of an exclusive first ground pin. Finally, any ordinary test signals are assigned more than four pins from any critical test signals.

2 Claims, 17 Drawing Sheets

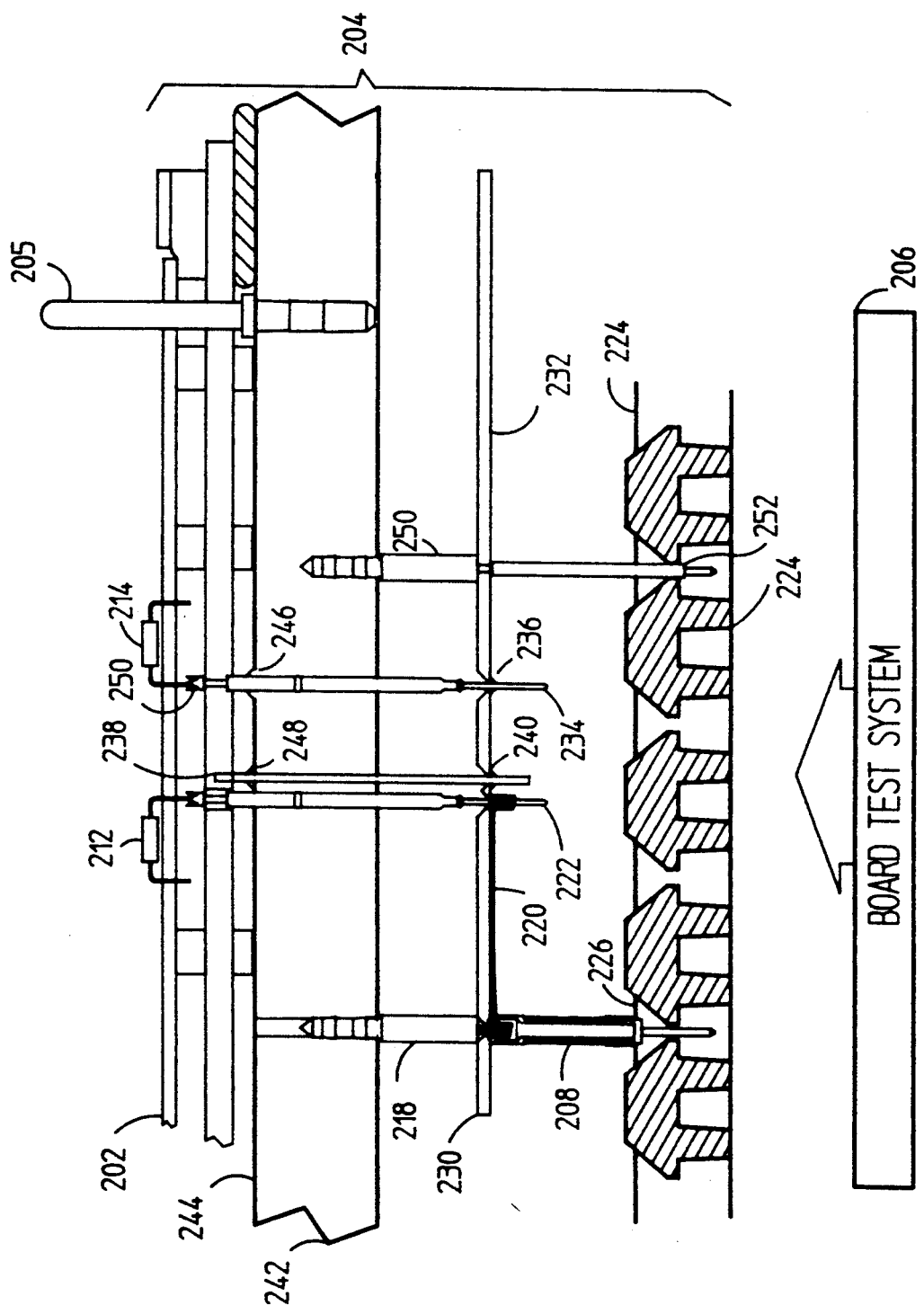

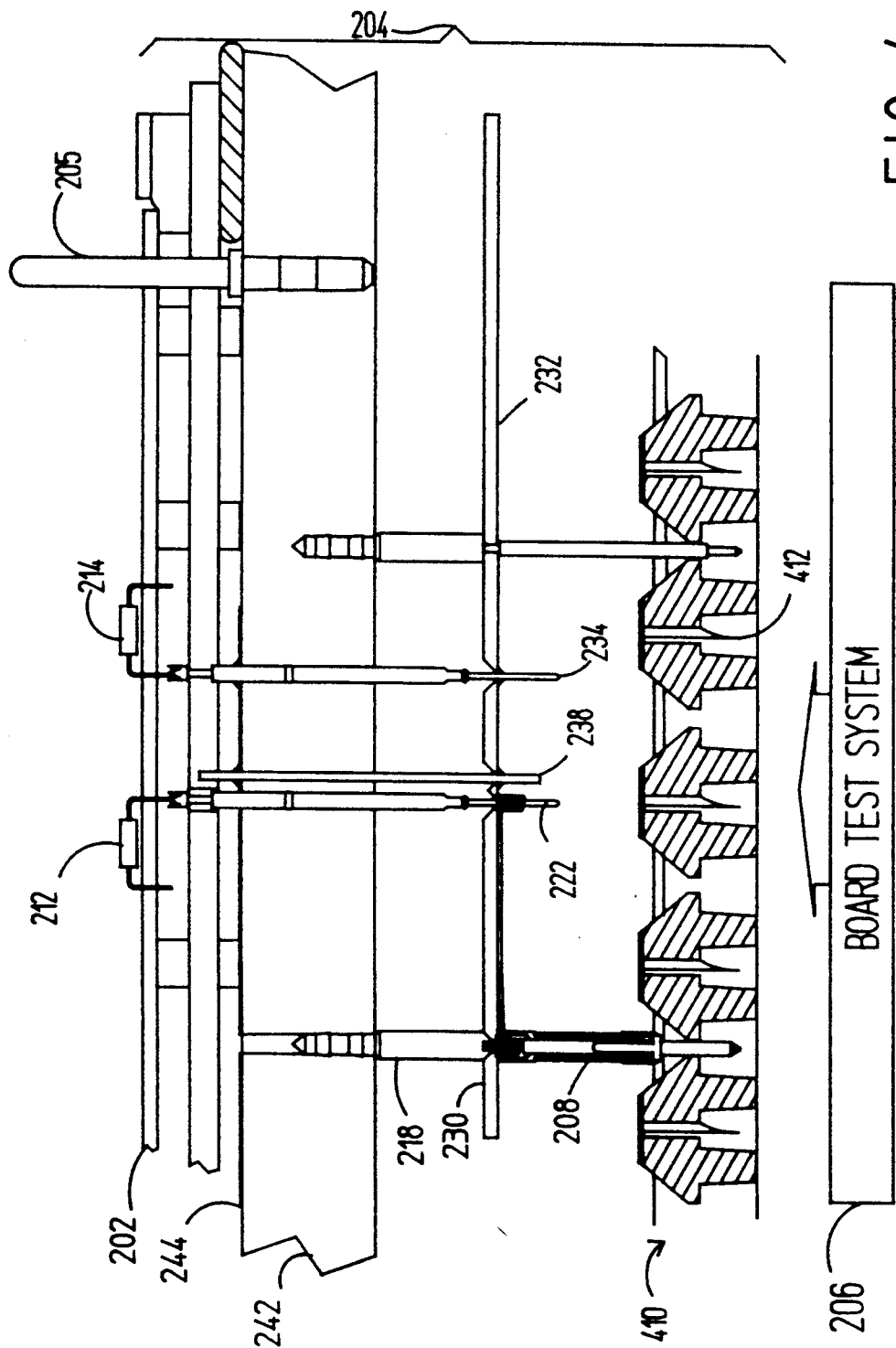

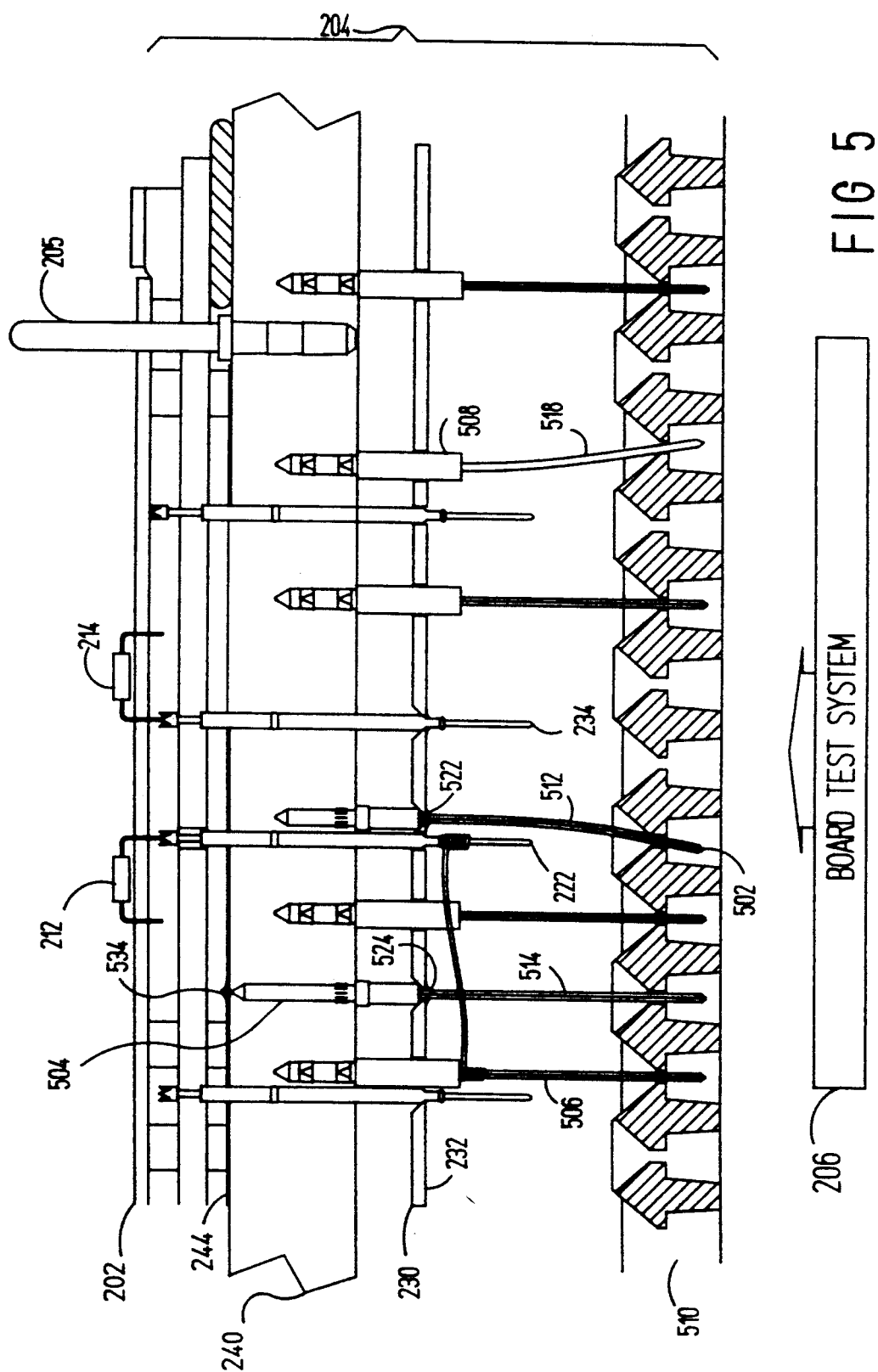

METHOD FOR THE CONTROL OF GROUND BOUNCE BELOW AN INTERNAL GROUND PLANE IN A SHORT-WIRE BOARD TEST FIXTURE

CROSS REFERENCE TO RELATED APPLICATION(S)

This is a continuation of copending application Ser. No. 07/761,540 filed on Sept. 18, 1991, now abandoned.

BACKGROUND OF THE INVENTION

I. Field of the Invention

The present invention generally relates to the testing of electronic circuit boards and, more particularly, to board test fixtures and methods thereof for electrically interconnecting electronic circuit boards and the like to electrical test systems.

II. Related Art

A board test system consists of numerous electronic drivers (sources) and receivers (detectors) which are connected through an electronic switching mechanism, often referred to as a "scanner", to a plurality of contact points referred to as scanner pins. A board test fixture then provides an interface between these scanner pins and the electronic components located on an electronic circuit board. Because the electronic test signals which are used to determine whether the electronic component is operating properly must pass through the board test fixture both on their way to and from the electronic component, the board test fixture must maintain the signal quality of the test signals to ensure that the electronic component is not incorrectly diagnosed as operating either properly or improperly.

It has been recognized in the art that in order to ensure maximum test signal quality, the length of the signal path between the scanner and the electronic circuit board must be kept as short as possible. This factor normally dictates a short vertical coupling of the test system and the circuit board. In other words, a "short-wire" board test fixture is designed to sit directly on top of the scanner and the electronic circuit board directly on the board test fixture. Furthermore, any board test fixture must be easy to assemble and maintain in order to be readily usable and cost effective. Finally, the ability to automate the assembly of the fixture is also an important feature.

U.S. Pat. No. 4,799,007 to Cook et al, which is incorporated herein by reference, describes a board test fixture which provides short and reliable connections between a test system and a circuit board under test. The foregoing short-wire fixture provides for good signal fidelity with digital signals up to approximately 6 megahertz (MHz). However, due to electrical parasitics, signal fidelity begins to fall off above about 6 MHz, and the ability to accurately test can become difficult above around 12 MHz.

The electrical parasitics phenomenon is discussed with reference to FIG. 1. Electrical parasitics become apparent in the form of a phenomenum known in the art as "ground bounce" or voltage/current "spikes". Ground bounce is often caused by the quick transitioning of the outputs of the circuit board under test. As shown in FIG. 1 at reference 102, the various outputs of the circuit board under test are connected to the receivers of the test system via the board test fixture. Furthermore, as shown at reference 104, the inputs of the board under test are connected to driver outputs of the test system via the board test fixture. The board test fixture comprises wiring which is schematically shown in FIG. 1 as inductances $L_r$, $L_g$, $L_d$.

Now, in operation, when a circuit board output 106 switches, the receiver input current $I_r$ must pass through the fixture wiring to charge the input capacitance $C_r$ of the receiver 108. The capacitance $C_r$ comprises the actual receiver input capacitance in combination with the board trace capacitance. The magnitude of the charging current $I_r$ can be predicted from the following formula: $I_r = C_r * (dV_r/dt)$. Because the capacitance $C_r$ is largely fixed in the board test system, the primary determining factor in the magnitude of the current $I_r$ is the switching speed of the board output.

The current $I_r$ which flows from the board output to the test system must in some way return to the circuit board under test by some electrical path in order to satisfy Kirchoff's current laws. While a small part of the current $I_r$ may be returned by other paths, the majority of it will flow through the fixture ground wires, as indicated by reference 110 as a current $I_g$.

The ground current $I_g$ flowing through the fixture ground wiring will induce a voltage $V_g$ across the wire inductance $L_g$, wherein $V_g = L_g * (dI_g/dt)$. As indicated by the foregoing equation, the switching speed of the circuit board under test affects the voltage $V_g$ across the wire inductance $L_g$. In other words, the induced voltage $V_g$ appears between the circuit board ground and the test system ground, as shown.

A voltage difference between the two grounds, i.e., or ground bounce, has extreme adverse effects as described hereafter. The output voltage of the driver 112 is maintained at a constant level with respect to the test system ground (assuming that the driver 112 is not switching). The board inputs of the circuit board 114 exhibit very high impedance, so very little current $I_d$ will flow through the fixture wiring having inductance $L_d$. Thus, because the current $I_d$ is minimal, very little voltage $V_d$ is developed across the fixture wiring, pursuant to the aforementioned inductance equation. Moreover, the board input voltage will follow the driver output voltage, resulting in $V_g$ being impressed on the board input. When the ground bounce voltage is impressed on the board input, there is a risk of causing the input voltage to cross the logic threshold associated with the board input.

In the case of purely combinational logic circuit, the ground bounce predicament is not a severe risk, because a waiting period can be implemented to settle out the adverse effects. However, in the case of a sequential logic circuit for which this input is a clock or other state determining element, the state of the circuit is changed, and the test will fail no matter how slowly the test is advanced.

SUMMARY OF THE INVENTION

The present invention selects the locations for critical signal paths below a ground plane in a short-wire board test fixture so as to minimize ground bounce. The board test fixture interfaces a test system to a circuit board under test. Critical signals are those signals susceptible to ground bounce, caused, for example, by fast switching. The test signal pins connect a ground plane in the board test fixture to pin cards interfaced to the board test system. Each pin card has a first column of test signal pins and a set of first ground pins. Moreover, each pin card has a second column comprising a set of second ground pins.

In accordance with the present invention, no more than fifteen second ground pins per pin card are inactive. No more than two consecutive second ground pins per pin card are inactive. Any critical test signals are assigned within three pins of an exclusive first ground pin. Finally, any ordinary test signals are assigned more than four pins from any critical test signals.

The present invention overcomes the deficiencies of the prior art, and further provides for the following additional features and advantages.

The present invention provides for an excellent distributed ground system through the board test fixture to the circuit board under test.

Very high speed testing is permitted by minimizing any ground bounce. Signal fidelity through the board test fixture is adequate for test frequencies of over 50 MHz.

The present invention is particularly useful for assigning ground and test signal probes for the novel board test fixture(s) set forth in the copending application entitled "ENHANCED GROUNDING SYSTEM FOR SHORT-WIRE LENGHTED FIXTURE" having Ser. No. 07/741,719, filed Aug. 7, 1991 to Cook et al., which is assigned to the assignee of the present application.

Further features and advantages of the present invention will become apparent to one skilled in the art upon examination of the following drawings and the detailed description. It is intended that any additional features and advantages be incorporated herein.

BRIEF DESCRIPTION OF THE DRAWINGS

The present invention, as defined in the claims, can be better understood with reference to the text and to the following drawings. The drawings are not necessarily to scale, emphasis being placed instead on clearly illustrating principles of the present invention.

FIG. 2 shows a first embodiment of a board test fixture wherein a ground system uses a plated alignment plate and a coax assembly;

FIG. 4 illustrates a second embodiment of a board test fixture wherein the ground system uses a ground comb and a coax assembly;

FIG. 5 illustrates a third embodiment of a board test fixture wherein the ground system uses ground personality pins;

DETAILED DESCRIPTION OF THE PREFERRED EMBODIMENT

Figure 1:
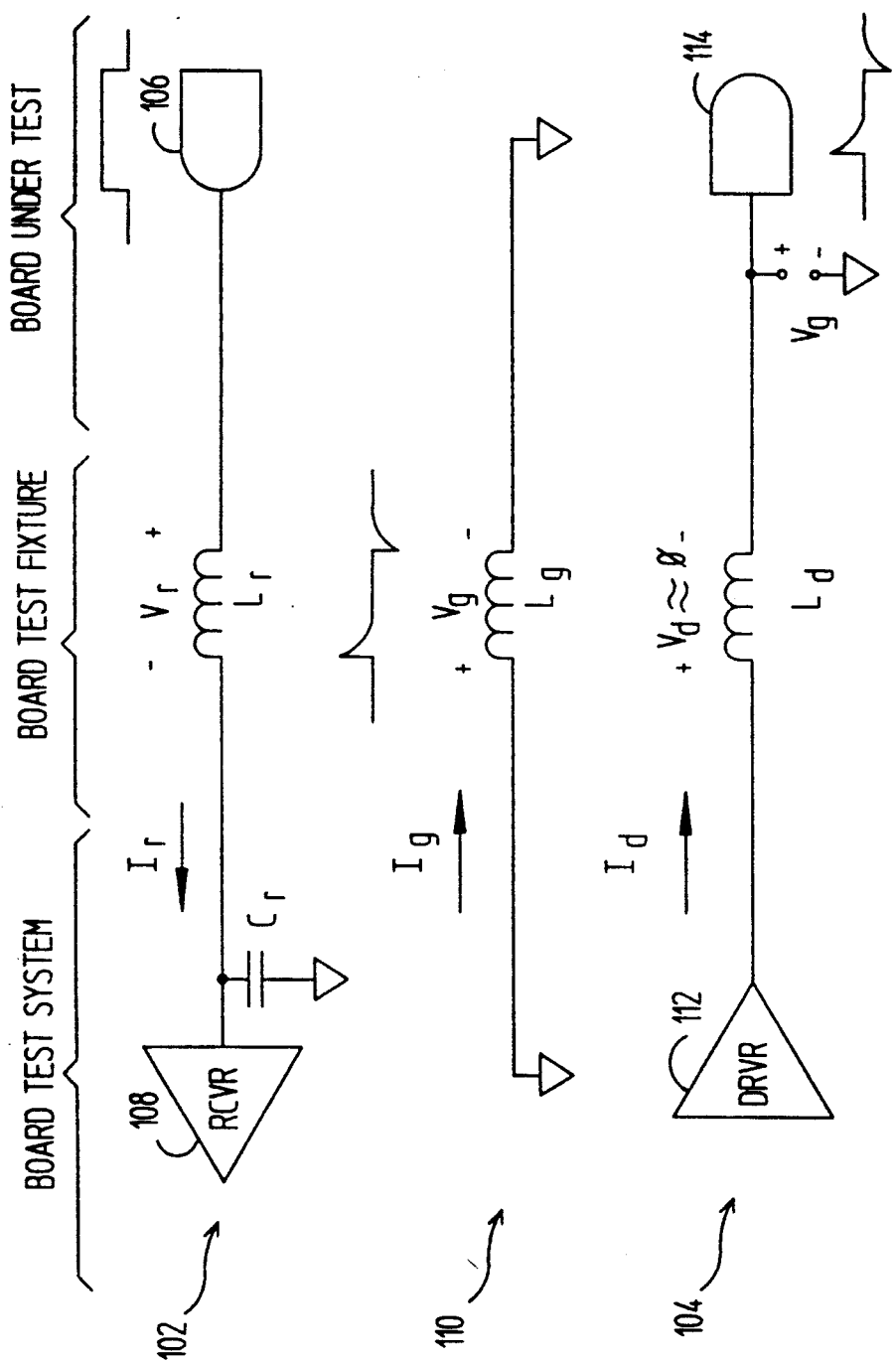
FIG. 1 illustrates the electrical ground bounce problem solved by the present invention.

I. Board Test Fixtures
II. Assigning The Location Of Test Signal And Ground Probes (Above Internal Ground Plane)
III. Assigning The Location Of Mint And Personality Pins (Below Internal Ground Plane)

I. Board Test Fixtures

FIGS. 2–5 illustrate several embodiments of board test fixtures set forth in the copending application entitled "ENHANCED GROUNDING SYSTEM FOR SHORT-WIRE LENGHTED FIXTURE" having Ser. No. 07,741,719, filed Aug. 7, 1991, to Cook et al., which is assigned to the assignee of the present application. The present invention is envisioned for particular use in these embodiments, and accordingly, the foregoing document is incorporated herein by reference. However, it should be noted that the present invention is applicable to other board test fixture designs.

FIG. 2 shows a first embodiment of a board test fixtures. As shown in FIG. 2, a circuit board 202 to be tested is placed on top of a board test fixture 204 via the guidance of an alignment pin 205. The board test fixture 204 provides an electrical interface between the circuit board 202 and the board test system 206. In other words, many test signals travel through the board test fixture 204.

The first embodiment envisions implementing a grounding system which utilizes ground coax assemblies 208 and a plated alignment plate 210 in the board test fixture 204, as are described in detail below. The grounding system permits testing of the circuit board 202 at very high speeds.

Various test signal paths travel from the board test system 206 through the board test fixture 204 to electronic components 212,214 on a circuit board 202 under test. As shown in FIG. 2, for example, a test signal from the board test system 206 travels through the wire-wrapping pin 216 of a personality pin 218, through a wire 220, and then through a signal probe 222, respectively, before reaching the electronic component 212. The location of the personality pins and the signal probes as well as the length of their connecting wires changes depending upon the orientation of electronic components 212,214 on the circuit board 202 under test.

Various ground paths also travel through the board test fixture 204 between the circuit board 202 under test and the board test system 206. Ground connectors from the board test system 206 contact the bottom of the board test fixture 204 in order to make the ground path available to the fixture 204.

At the bottom of the fixture 204 is the alignment plate 210, which serves as a focus means to capture and guide personality pins 218, which carry test signals, into an organized orthogonal array-like pattern when the alignment plate 210 is installed so that the board test system 206 can send test signals through the fixture 204.

However, the alignment plate 210 further serves as a ground conductance means. It comprises an inner nonconductive support material 223 and a conductive outer plating 224 on all of its exposed surface areas, including the top, bottom, and throughways. The plating 224 is preferably a metal. In the embodiments, the metal is a combination of copper and nickel or a combination of copper, nickel, and gold, in order to provide an excellent transitional ground path from the board test system 206 to the top 226 of the alignment plate 210. The plated alignment plate 210 provides a good impedance control because it positions the ground path near the signal paths.

In order to provide the ground path from the top 226 of the alignment plate 210 upward through the board test fixture 204 while maintaining the ground near the signal paths, the coax assembly 208 is positioned concentrically around each signal path, specifically each personality pin, which carries a signal posing a potential ground bounce problem. Such signal paths are called "critical" signal paths. The critical signal paths are usually those paths which carry electrical signals which switch at a high speed.

Figure 3A:
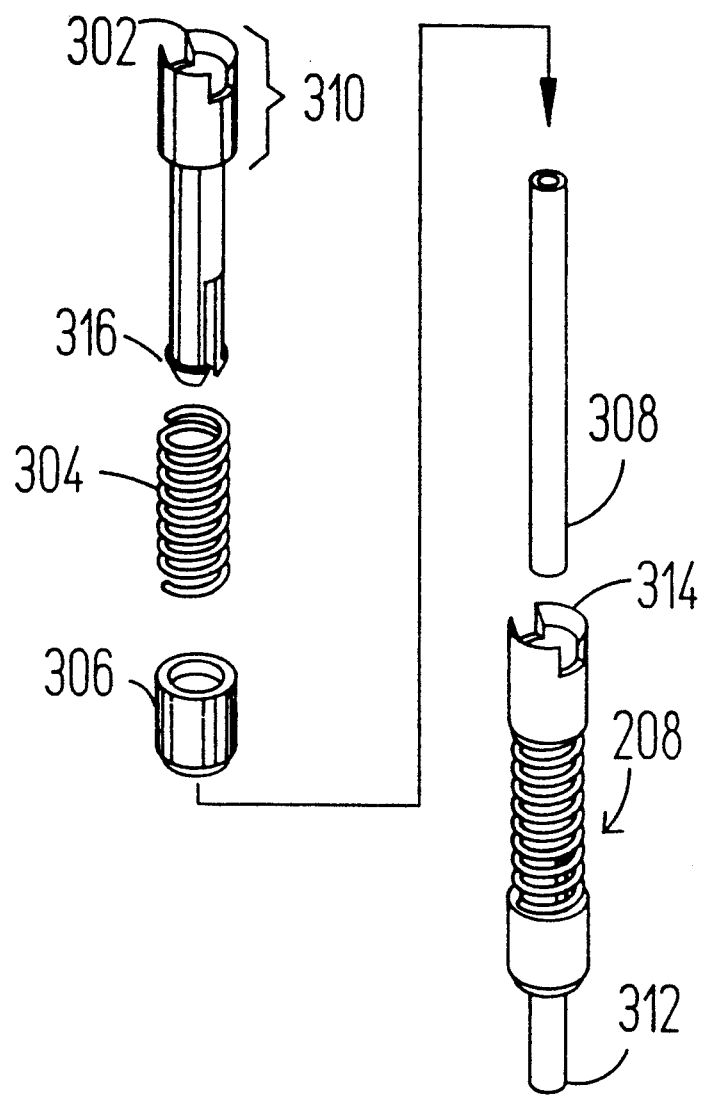
FIG. 3 shows a coax assembly for personality pins.
Figure 3B:
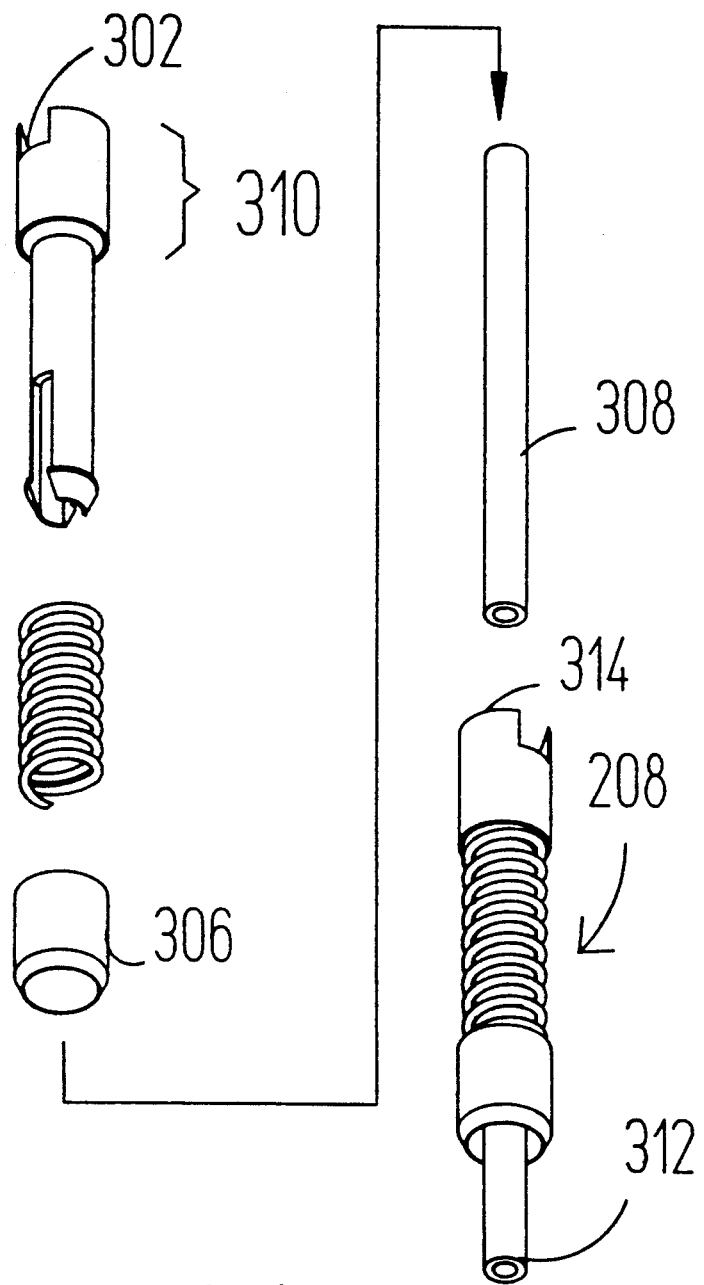

The ground signal carried by the coax assembly 208 is isolated from the internal wire-wrap pin 216 via a piece of plastic tubing 228. As shown in FIG. 2, the plastic tubing 228 extends from the wire wrap at the base of the wire-wrap pin 216 to just short of the tip of the pin 216. The plastic tubing 228 extends down through the plated alignment plate 210 in order to prevent the pin 216 from contacting the plating 224, thereby tainting the test signal on pin 216. FIGS. 3(a) and 3(b) show in detail the ground coax assembly 208.

As shown in FIGS. 3(a) and 3(b), the ground coax assembly comprises a conductive, internal coax sleeve 302, a spring 304, a conductive, external coax sleeve 306, and a plastic insulator 308. The sleeve 302 is notched, as shown, so as to permit access of the a wire to the enclosed personality pin. The wire wrap would be enclosed by the enlarged region 310. Further, the bottom part 312 and the top part 314 of the coax assembly 208 are forced apart by the compression spring 304. A stop 316 is designed to catch the external coax sleeve 306 to prevent the coax assembly 208 from coming completely apart.

With reference again to FIG. 2, the top part 314 of the coax assembly 208, which has sharp edges, is pressed against an internal ground plane 230 mounted inside the board test fixture 204 by the spring 304. The bottom part 312 of the coax assembly 208 is forced by the spring 304 against the metal plating 224 of the alignment plate 210 described above. The internal ground plane 230 has plating 232 at its underside only and is located near the base of the wire-wrap pin 216.

The signal wire 220, which passes between the notch at the upper part 314 of the coax assembly 212, is routed in very close proximity to the internal ground plane 230 in order to provide strip line impedance control for the critical signal wire. It should be noted that once the wire 220 leaves the plating 232 of the internal ground plane 230 by more than ½ a wire diameter, or so, the impedance adversely rises quickly.

From the plating 232, the ground signal is provided to the circuit board 202 via the various ground probes and various ground pins which are soldered to the plating 232. As illustrated in FIG. 2, a ground probe 234 is soldered to the plating 232 at a point 236. Moreover, a small ground pin 238 is soldered to the plating 232 at a soldering point 240. Both the ground probe 234 and the ground pin 238 carry the ground signal through a probe plate 242 to an external ground plane 244, which is optional. As shown, the ground probe 234 and the ground pin 238 are soldered to the external ground plane 244 at respective soldering points 246 and 248. Further note that, unlike the ground pin 238, the ground probe 234 extends further upward in order to contact the ground on the electronic component 214 in a direct manner to make an electrical contact 250.

Care is taken so that the small ground pin 238 is associated in close proximity to the signal probe 222. This close association helps substantially in controlling impedance. A number of small ground pins could be clustered around a critical signal path if warranted.

Worth noting is that if a high degree of impedance control is not required in the test fixture 204, the external ground plane 244 and the array of small ground pins, such as the ground pin 238, may be conveniently eliminated from the structure. Such a simplified fixture would be cheaper and much easier to construct.

Finally, for those personality pins which do not have a corresponding coax assembly 208, an insulator, such as for example the plastic insulator 308, is provided to surround the corresponding wire-wrap pin so that it does not contact the plating 224 on the alignment plate 210. As shown in FIG. 2, the personality pin 250 is concentrically surrounded along its axis by an insulator 252.

FIG. 4 illustrates a second embodiment of a board test fixture. The second embodiment is similar to the first embodiment of FIG. 2 in many respects. However, the alignment plate 410 of FIG. 4 does not comprise a conductive outer plating, as does the alignment plate 210 of FIG. 2.

Instead, the alignment plate 410 comprises a ground comb 412, which is a sheet metal part placed, bonded, or affixed in some fashion, onto the alignment plate 410. In the second embodiment, the ground comb 412 is affixed to the alignment plate 410 via a snapfit arrangement. In the snap-fit arrangement, the ground comb 412 comprises one or more protruding parts which snap into the alignment plate 410 to thereby hold the ground comb 412 contiguous to the alignment plate 410.

Essentially, the ground comb 412 communicates the ground from the board test system 206 through the alignment plate 410 to any coax assemblies 208. It should be noted that the plated alignment plate 210 of FIG. 2 provides slightly better impedance control than the combination of the ground comb 412 and alignment plate 410 of FIG. 4 because it generally provides a ground path more closely coupled to the signal paths. However, the plated alignment plate technique is more expensive than the ground comb technique. Consequently, a cost versus performance analysis must be performed in order to select the best option for a particular embodiment.

FIG. 5 shows a third embodiment of the board test fixture 204 wherein an array of ground personality pins 502, 504 are implemented in order to control impedance through the board test fixture 204. The array of ground personality pins 502, 504 are intermixed among the array of test signal personality pins 506. The ground personality pins 502,504 can be clustered, if desired, around critical signal paths to more efficiently control impedance.

The ground personality pins 502,504 are mounted in the probe plate 240 and their wire-wrap pins 512,514 are then soldered to the internal ground plane 230, as indicated at reference numerals 522,524. The ground personality pins 502,504 are made available to the board test system 206 via an alignment plate 510.

The alignment plate 510 is essentially composed of a non-conductive plastic material. The alignment plate 510 essentially serves as a focus means to capture and guide both the ground personality pins 502,504 and the test signal personality pins 506 into an organized orthogonal array-like pattern when the alignment plate 510 is installed, so that the board test system 206 has easy access to both types of pins at the bottom of the board test fixture 204.

To this end, the ground personality pins 502,504 as well as the test signal personality pins 506,508 may bend, as shown by respective wire-wrap pins 512,518 in order to pass through the alignment plate 510 to the board test system 206.

In accordance with another aspect of the third embodiment, the metal bodies of the ground personality pins 502,504 may extend out past the top of the probe plate 240, where their top ends may be soldered to the external ground plane 244, thus further controlling impedance. FIG. 5 illustrates the ground personality pin 504 with its metal body extended and soldered to the external ground plane 244, as indicated by reference numeral 534. As with the other previously-mentioned embodiments, it should be emphasized that the external ground plane 244 is an optional feature of the embodiments. If the external ground plane 244 is not needed, the bodies of the ground personality pins 502,504 need only be long enough to press into the probe plate 240. Needless to say, in this case, the bodies of the ground personality pins 502,504 need not be conductive.

The holes in the internal ground plane 230 for the ground personality pins 502,504 can be sized in order to allow soldering to the internal ground plane 230. If too much hole clearance exists, soldering can be difficult. In contrast, clearance for test signal personality pins 512 need to be great enough to guarantee that the pins 512 will not accidentally touch the plating 232 of the internal ground plane 230. Furthermore, in order to help capture all of the ground personality pins 502,504 at once when the internal ground plane 230 is installed, the small clearance holes in the internal ground plane 220 should be countersunk, as shown.

Assigning The Location Of Test Signal And Ground Probes

Figure 6:
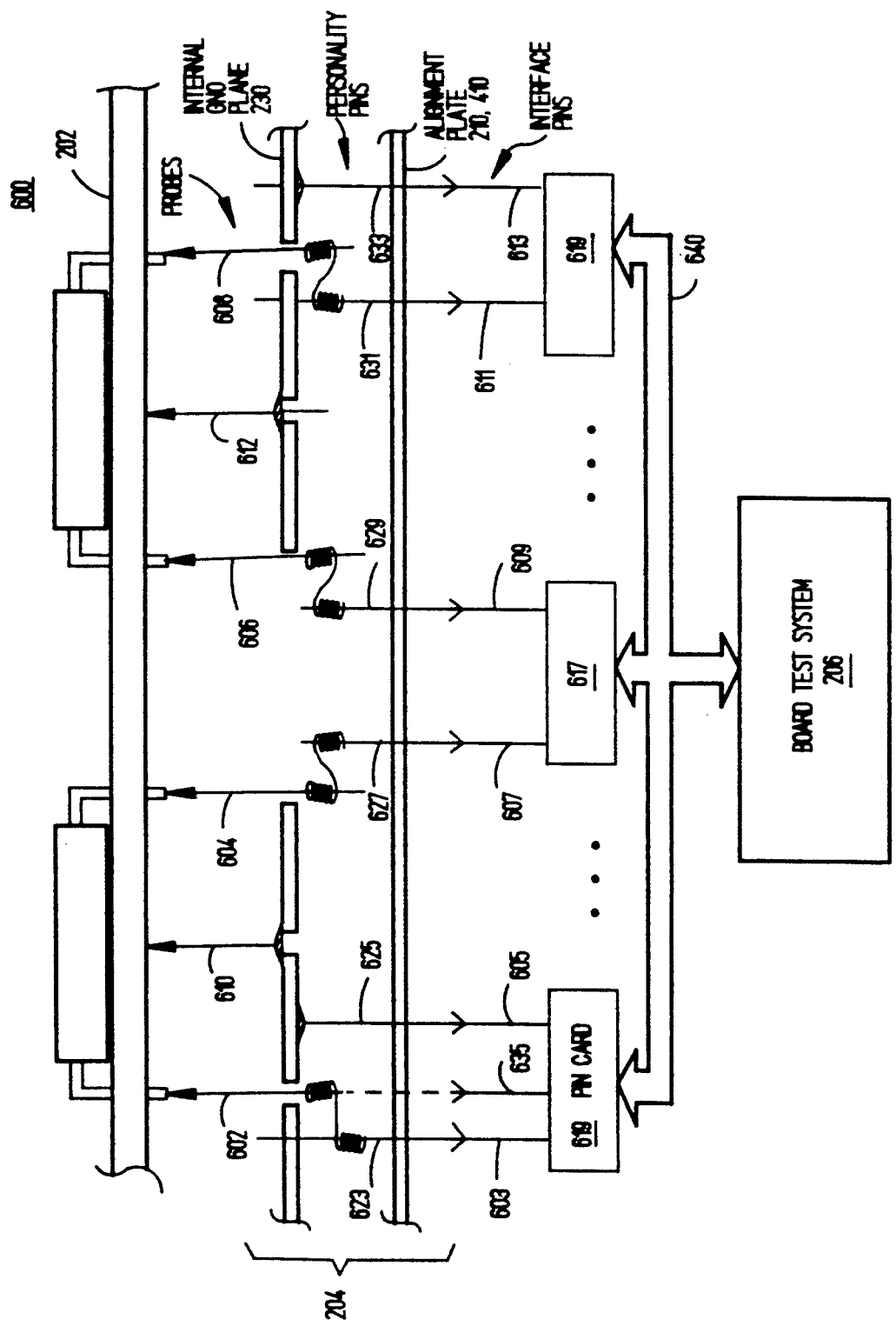
FIG. 6 shows a high level block diagram of a generic board test fixture connecting a circuit board under test to a board test system wherein personality pins as well as mint pins below an internal ground plane within the board test fixture are spatially situated in accordance with the present invention.

FIG. 6 shows a high level block diagram of the board test fixture 204 connecting the circuit board 202 under test to the board test system 206 and having test signal probes 602,604,606,608 and ground probes 610,612. The ground probes 610,612 carry ground signals between the circuit board 202 and the internal ground plane 230.

The quantity and spatial orientation of the test signal probes 602,604,606,608 and ground probes 610,612 are determined to minimize ground bounce in accordance with the present invention. This is accomplished in the preferred embodiment using sophisticated algorithms implemented in software. However, it should be noted that the algorithms could be implemented using a hardware approach or a hardware/software approach. Moreover, it should be further noted that the quantity and location of the test signal probes 02,604,606,608 and ground probes 610,612 can be determined in many different ways, perhaps even at random, in order to control ground bounce. As determined by the inventors, the gist of any methodology should involve situating, perhaps clustering, ground probes 610,612 near test signal probes 602,604,606,608 carrying critical test signals to thereby minimize ground bounce.

An existing software program called "Probe Select", which has been designed and commercially distributed by the Hewlett-Packard Company, Inc., Loveland, Colo., USA, determines where to position the probes on the circuit board 402 under test. The existing Probe Select program takes into consideration certain criteria when determining the placement of probes. These criteria are highly dependant upon the particular circuit board 202 under test and, generally, are as follows: blockage of testing resources if a signal probe is positioned in a certain location, physical proximity of the signal probes, and others. The operation of the existing Probe Select program as well as the criteria considered during operation of the program are set forth in the 12-volume publication entitled, *HP 3070 Board Test System, User's Documentation Set*, HP Part No. 44930A (1989), which is incorporated herein by reference. Specifically, see § 5.3.2 of Volume 2.

During operation in the existing Probe Select program, the program isolates electrical nodes, e.g., a soldering point or strip, on the circuit board 202 and then determines where to position a probe on the electrical node. During this procedure, the Probe Select program assigns a "score" to all the potential probing locations on the electrical node. In the preferred embodiment, the score is just a number. The magnitude of the score is a measure of how well the particular probing location conforms to the criteria which the Probe Select program considers important. The score for a probing location is increased every time the Probe Select program discovers a detrimental feature in regard to the probing location. Accordingly, probing locations with low scores are better choices for signal probes than locations with high scores. After evaluating the scores for all probing locations on the electrical node, the Probe Select program positions the signal probe at the location with the low score.

It should be noted that for ground nodes on the circuit board 202, the inventors have determined that usually more than one ground probe is desirable in order to control ground bounce. However, multiple ground probes for a ground node is not a requirement.

For ground probes, the existing Probe Select program can make up to three passes through a list of probing locations in an attempt to acquire the highest number of probing locations which meet the specified criteria. First, the existing Probe Select program passes through the list and selects all probing locations on the electrical node whose score is below a preselected "first score threshold". Before executing another subsequent pass, a check is made against a preselected "first count threshold" to determine whether enough probing locations have already been selected. If not enough have been selected, then the existing Probe Select program passes again through the probing locations and selects those probing locations whose score is below a preselected "second score threshold", which is somewhat higher than the first score threshold. Before executing another subsequent pass, a check is made against a preselected "second count threshold" to determine whether enough probing locations have already been selected. If not enough have been selected, then the existing Probe Select program passes again through the probing locations and selects those probing locations whose score is below a preselected "third score threshold", which is even higher than the second score threshold. Notwithstanding the foregoing count and score thresholds, it should be noted that certain probing locations are so bad, in terms of the important criteria, that they can never be used as probes, even though they are the only probing locations available on the electrical node.

In accordance with the present invention, the existing Probe Select program has been modified to assign the location of the ground probes 610,612 in a different manner. In the present invention, the score for ground probing locations is computed using a different set of criteria, and also, a different set of count thresholds is used in regard to the number of selected probes.

The new set of criteria considered by the modified Probe Select program in the preferred embodiment when evaluating ground probing locations are as follows: (1) sufficient ground probes must exist to carry the power supply current used to power the circuit board 202 under test; (2) each ground probe should reside within one inch of every signal probe on an electrical node carrying a critical signal and (3) if an imaginary grid of 1.4"*1.4" squares is superimposed over the circuit board 202, no more than 5 signal probes for each ground probe should reside within a square. Note that criterion (1) above is performed in the existing Probe Select program, whereas criteria (2) and (3) are taught by the present invention. The foregoing criteria will be referred to hereafter during the description of the preferred embodiment. Moreover, these criteria were derived by the inventors via experimentation and ensure that a good electrical connection exists between the ground in the circuit board 202 and the internal ground plain 230 of the board test fixture 204.

Figure 7:
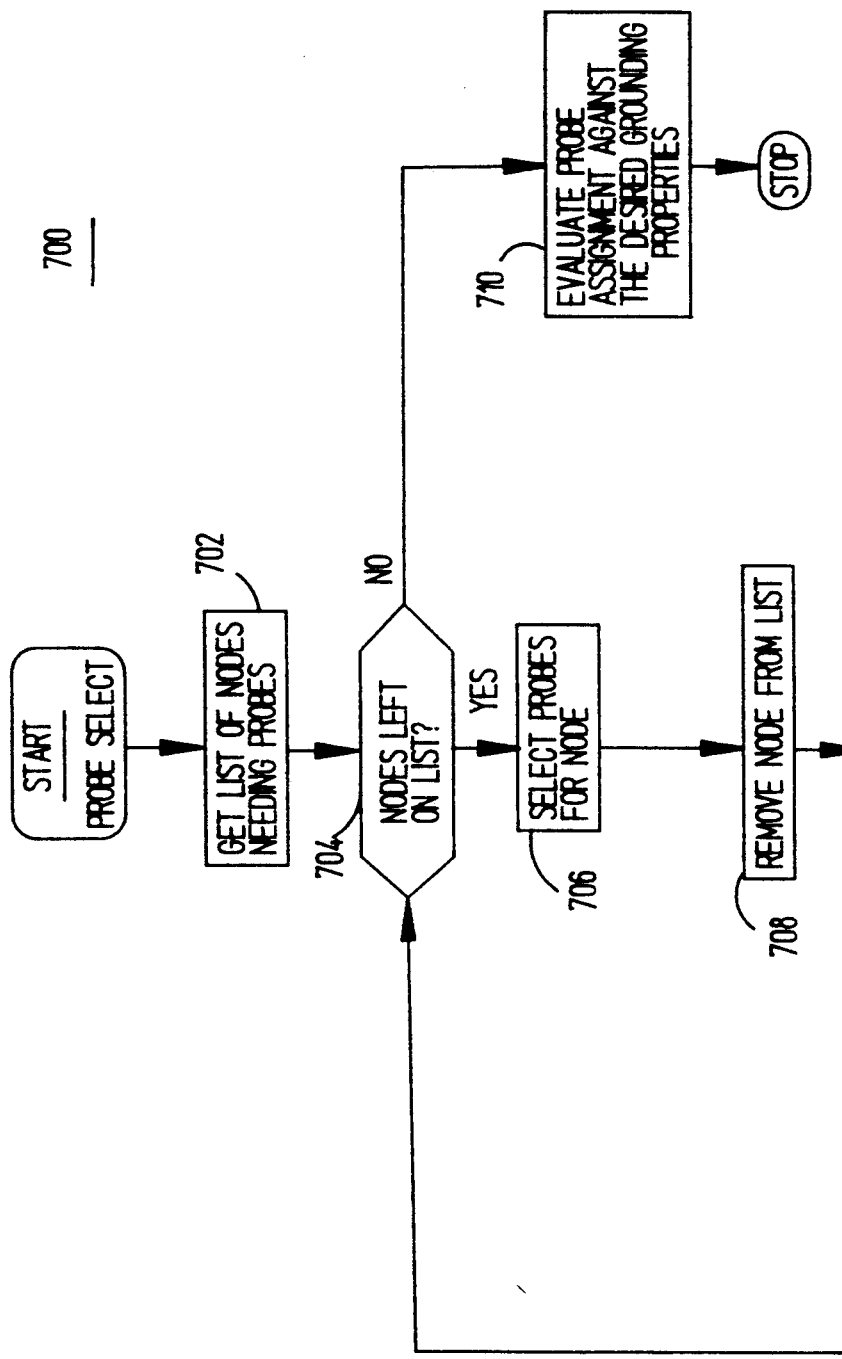
FIG. 7 illustrates a high level flowchart for the assignment of test signal probes and ground probes in generic board test fixture of FIG. 6.

The specific methodology in accordance with the preferred embodiment for determining the location of ground probes will now be described with respect to FIGS. 6-11. FIG. 7 illustrates a high-level flowchart 700 pertaining to the modified Probe Select program. Excepting the functionality as indicated in a flowchart block 710, the program structure of FIG. 7 substantially resembles the existing Probe Select program.

As indicated in the flowchart block 702, a list of electrical nodes needing probes is retrieved, or inputted into the modified Probe Select program.

Next, at a flowchart block 704, the methodology envisions cycling through a logic loop in order to consider each electrical node on the list. Consequently, at the flowchart block 704, an electrical node is retrieved from the list. Then, at a flowchart block 706, the probing locations are selected for the particular electrical node. Both signal probing locations and ground probing locations are specified. The selection of the probing locations is described hereinafter in detail with respect to the FIGS. 8-11. With reference back to FIG. 7, after the probing locations have been determined and specified, the electrical node is then removed from the list, as indicated by a flowchart block 708. Furthermore, another node is retrieved from the list, if any remain, as indicated by the flowchart block 704, and the procedure continues until all nodes have been considered.

After all nodes on the circuit board 202 have been analyzed, the methodology shown in flowchart 700 performs a final check as to whether the fixture 204 satisfies the criteria (2) and (3), mentioned above. In those cases where either of the criteria (2) or (3) is not satisfied, a warning to this effect is given to the program's user, but the modified Probe Select program makes no attempt to rectify the situation by adding more ground probes and/or moving test signal probes 602,604,606,608. Finally, the operation of the modified Probe Select program is concluded with all test signal and ground probing locations being specified.

Figure 8:
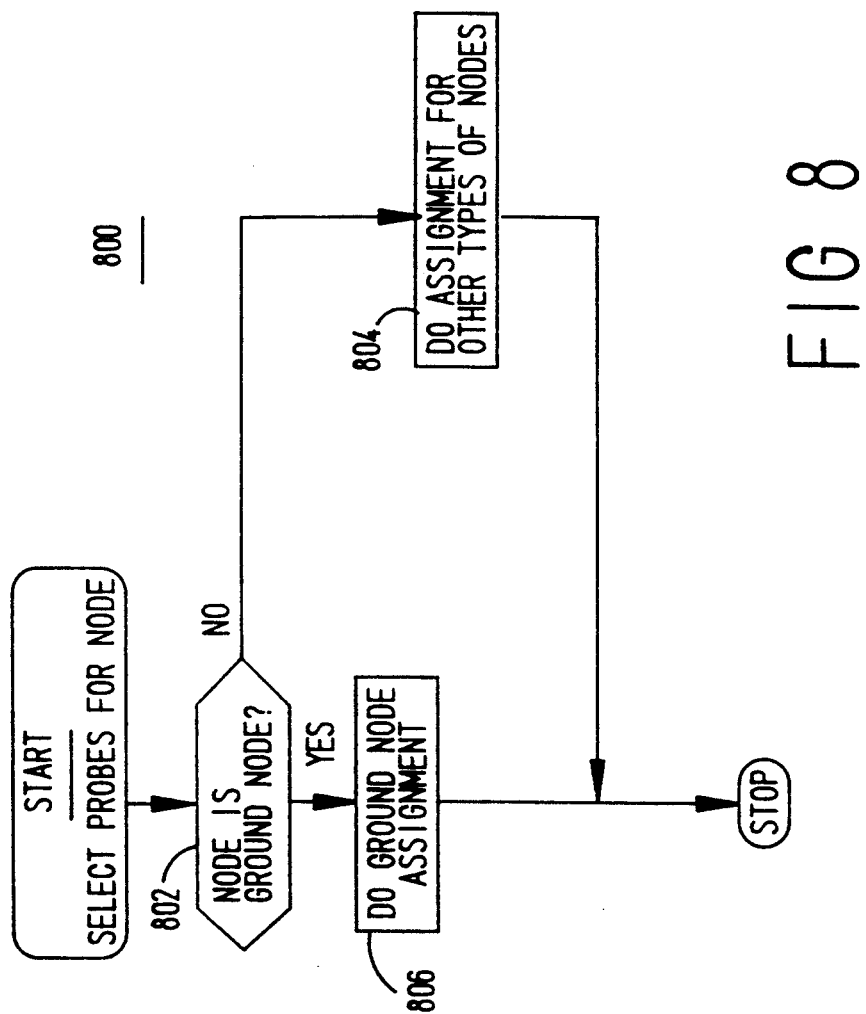
FIG. 8 shows a flowchart for selecting test signal and ground probes for an electrical node on a circuit board under test, as specified by the flowchart of FIG. 7.

FIG. 8 shows a high-level flowchart 800 pertaining to the methodology for selecting probing locations for each ground node at issue, whether it be a test signal or ground node. Recall that the selection of probing locations for an electrical node is specified in the flowchart block 706 of FIG. 7. The new program structure shown in FIG. 8 substantially resembles the existing Probe Select program.

With reference to flowchart block 802 of FIG. 8, it is first determined whether the node at issue is a ground node. If the node is not a ground node, then assignment of a test signal probe is performed as indicated in flowchart block 804. In the preferred embodiment, the test signal probes are assigned just as they are in the existing Probe Select program.

However, at the flowchart block 802, if the electrical node is a ground node, then the methodology envisions assigning ground probing locations to the ground node, as indicated in a flowchart block 806. The assignment of ground probing locations is discussed hereafter in detail in regard to FIG. 9.

Finally, after either the flowchart block 804 or the flowchart block 806, the methodology envisions returning to the flowchart block 706 of FIG. 7 in order to have the node removed from the node list and to retrieve another node.

Figure 9:
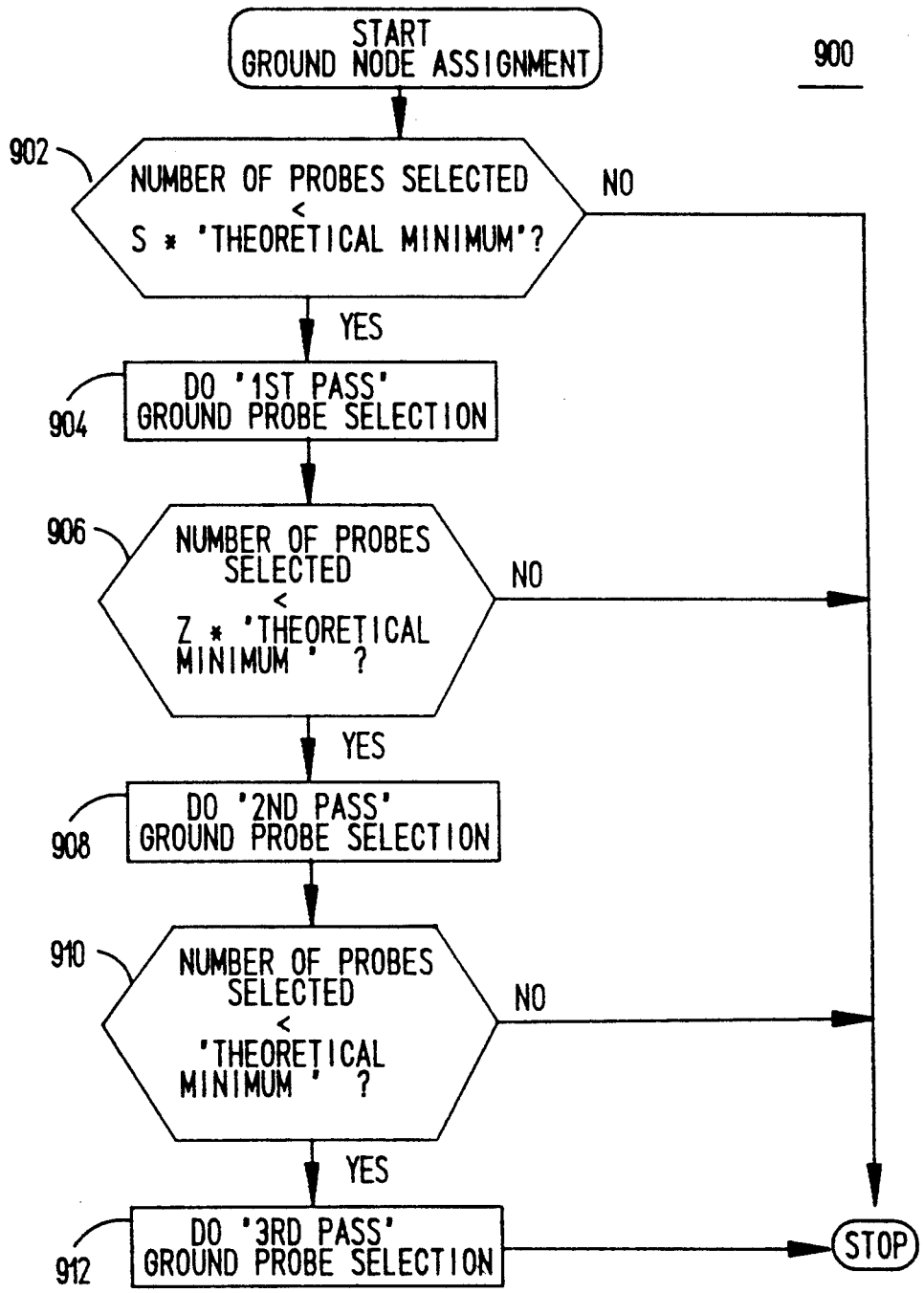
FIG. 9 shows a flowchart for assigning ground nodes, as specified by the flowchart of FIG. 8.

FIG. 9 illustrates a flowchart 900 pertaining to the assignment of ground probing locations to ground nodes, as specified in the flowchart block 806 of FIG. 8. The new program structure shown in FIG. 9 substantially resembles the existing Probe Select program.

As illustrated in FIG. 9, at a flowchart block 902, a check is made to determine if enough ground probing locations have already been identified for the ground node at issue. At a flowchart block 902, it is determined whether the number of ground probing locations selected is less than a preselected first count threshold. The first count threshold is novel. The first count threshold in accordance with the present invention is defined and computed as follows:

$$\text{first count threshold} = 5 * \text{theoretical minimum}$$

Furthermore, in accordance with the present invention, the "theoretical minimum" is defined and computed as follows:

$$\text{theoretical minimum} = \frac{\text{number of test signal nodes}}{5} + \text{power supply needs}$$

The above equations for computing the theoretical minimum and the first count threshold as well as all other novel count thresholds discussed in this document were derived through extensive effort and experimentation on the part of the inventors. Further, the theoretical minimum was derived in accordance with the present invention from the following observations: (a) a maximum signal-to-ground ratio of 5:1 cannot be achieved in every imaginary grid square as required by factor (3) above, unless the signal-to-ground ratio on the circuit board 202 is no more than 5:1 overall; (b) a minimum number of ground probes is needed for power supply current, as mentioned previously; and (c) each test signal node on circuit board 202 has only one test signal probe associated with it.

A more general computation of theoretical minimum is also envisioned wherein any number of test signal probes is associated with each test signal node on the circuit board 202. More specifically, the theoretical minimum in accordance with the present invention would be computed as follows:

theoretical minimum =

$$\frac{\Sigma \text{ test probes desired on test signal node } (i)}{5} + \text{power supply needs}$$

wherein the summation ($\Sigma$) is taken over all test signal nodes (i).

If it is determined that the number of ground probing locations is greater than or equal to the first count threshold, then the number is sufficient, and the flowchart 900 will stop, as shown. Alternatively, if it is determined that the number of ground probing locations selected is less than the first count threshold, then the number is insufficient, and the methodology envisions performing another pass ("first pass") through the ground probing locations. The ground probe selection taking place in flowchart block 904 is discussed in specific detail in FIG. 10 and is reserved for discussion hereinafter.

After the first pass has occurred, a second check is made to determine whether enough ground probing locations have been selected, as indicated in a flowchart block 906. The second check involves determining whether the number of selected ground probing locations is less than a preselected second count threshold. The computation of the second count threshold is novel. It is defined and computed as follows:

second count threshold = 2 * theoretical minimum

If the number of selected ground probing locations is not less than (i.e., greater than or equal to) the second count threshold, then the number is sufficient, and the methodology envisions stopping and returning to flowchart block 806 of FIG. 8. In the alternative, if the number is less than the second count threshold, then the methodology envisions performing another pass ("second pass") through the ground probing locations, as indicated by a flowchart block 908. As mentioned, ground probe selection is described in detail with respect to FIG. 10.

Referring back to FIG. 9, after the second pass has been performed, the number of selected ground probing locations is compared to a third count threshold. The computation of the third count threshold is novel. The third count threshold is computed as follows:

third count threshold = 1 * theoretical minimum

If the number of selected ground probing locations is not less than (i.e., greater than or equal to) the third count threshold, then the methodology envisions stopping and returning to flowchart block 806 of FIG. 8. Alternatively, if the number of selected ground probing locations is not sufficient, then the methodology envisions performing a still another pass ("third pass") through the ground probing locations, as indicated by a flowchart block 912. Again, ground probe selection is specified in FIG. 10.

Figure 10:
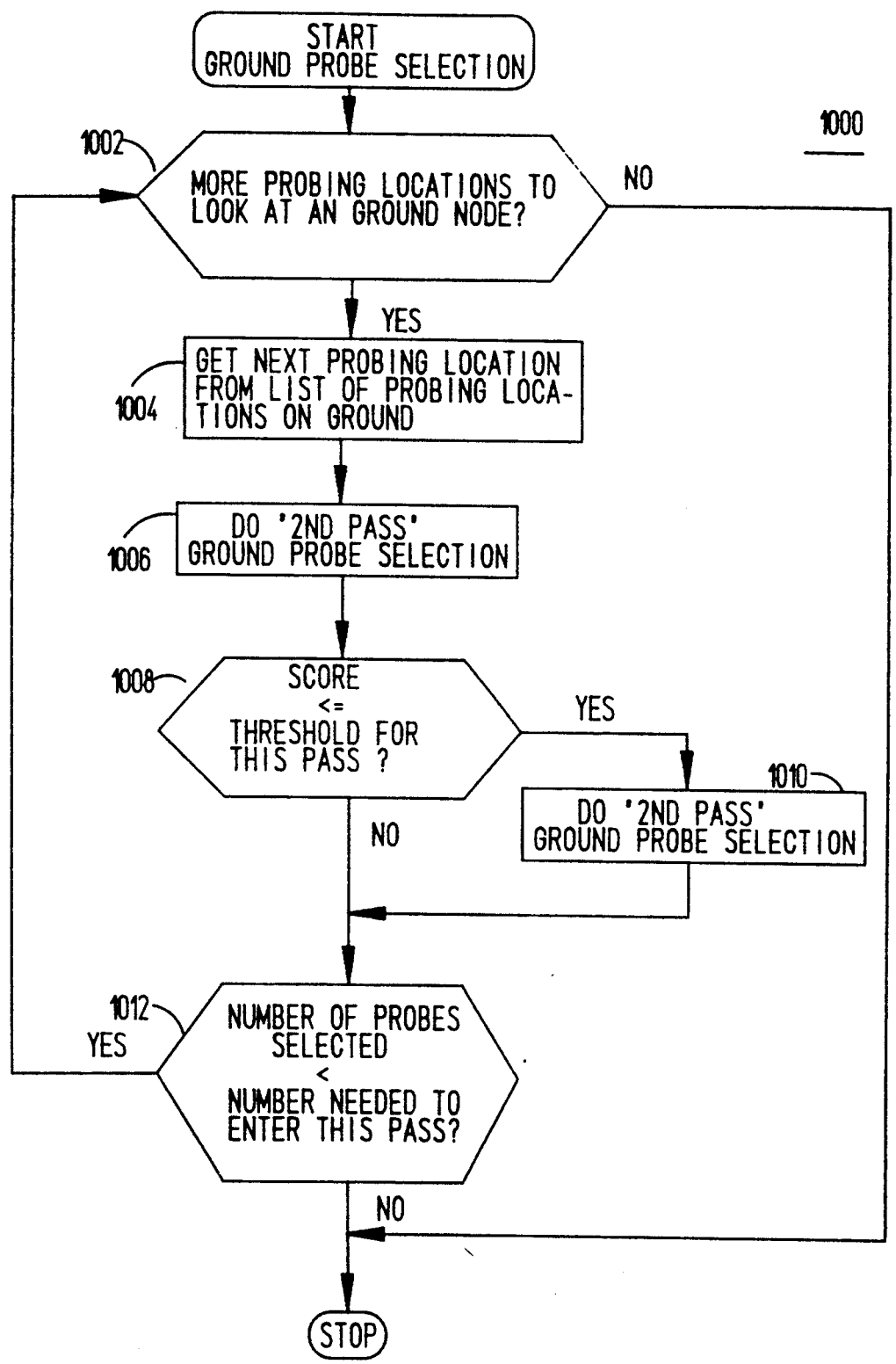
FIG. 10 illustrates a flowchart for selecting ground probes for a ground node, as specified by the flowchart of FIG. 9.

Referring to FIG. 10, ground probe selection begins at a flowchart block 1002. It should be noted that the structure of the flowchart 1000 resembles that of the existing Probe Select program.

At the flowchart block 1002, it is determined whether all ground probing locations have already been considered. If no ground probing locations exist for consideration, then the methodology envisions stopping and returning to the flowchart block 904, 909, or 912, whichever the case may be. Alternatively, if a probing location remains to be considered, then the probing location is retrieved from the list, as indicated in a flowchart block 1004.

At a flowchart block 1006, the score for the ground probing location at issue is computed. The computation of the probe score is novel and is geared toward distributing the ground probes in such a way so as to satisfy factor (3), mentioned above, of the present invention. To compute the score, the modified Probe Select program superimposes a 1.4"*1.4" imaginary grid over the circuit board 202 under test and keeps track of the number of test signal and ground probes within each square on the imaginary grid. The computation of the score will be discussed in more detail in regard to FIG. 11 hereafter.

After the score has been computed, it is determined whether the score is less than the predetermined score threshold corresponding to the particular pass. For example, if the flowchart 1000 had been initiated from the flowchart block 908, the score threshold would be the second score threshold pertaining to the second pass. If the score is less than the score threshold at issue, then a ground probe is assigned to this location on the circuit board 202, as indicated by a flowchart block 1010, and then the flowchart 1000 proceeds to flowchart block 1012. If the score is not less than (greater than or equal to) the score threshold at issue, then the methodology envisions proceeding to a flowchart block 1012.

At the flowchart block 1012, it is determined whether the number of ground probes selected is less than the number (first, second, or third count threshold) needed to initiate the particular pass (first second, or third pass, respectively). If the answer is affirmative, then the number of selected ground probing locations is still insufficient, and the methodology envisions proceeding to the flowchart block 1002, where another ground probing location is retrieved for consideration. In the alternative, the number of selected ground probing locations is sufficient and the methodology will stop and return to one of flowchart blocks 904, 908 or 912, whichever the case may be.

Figure 11:
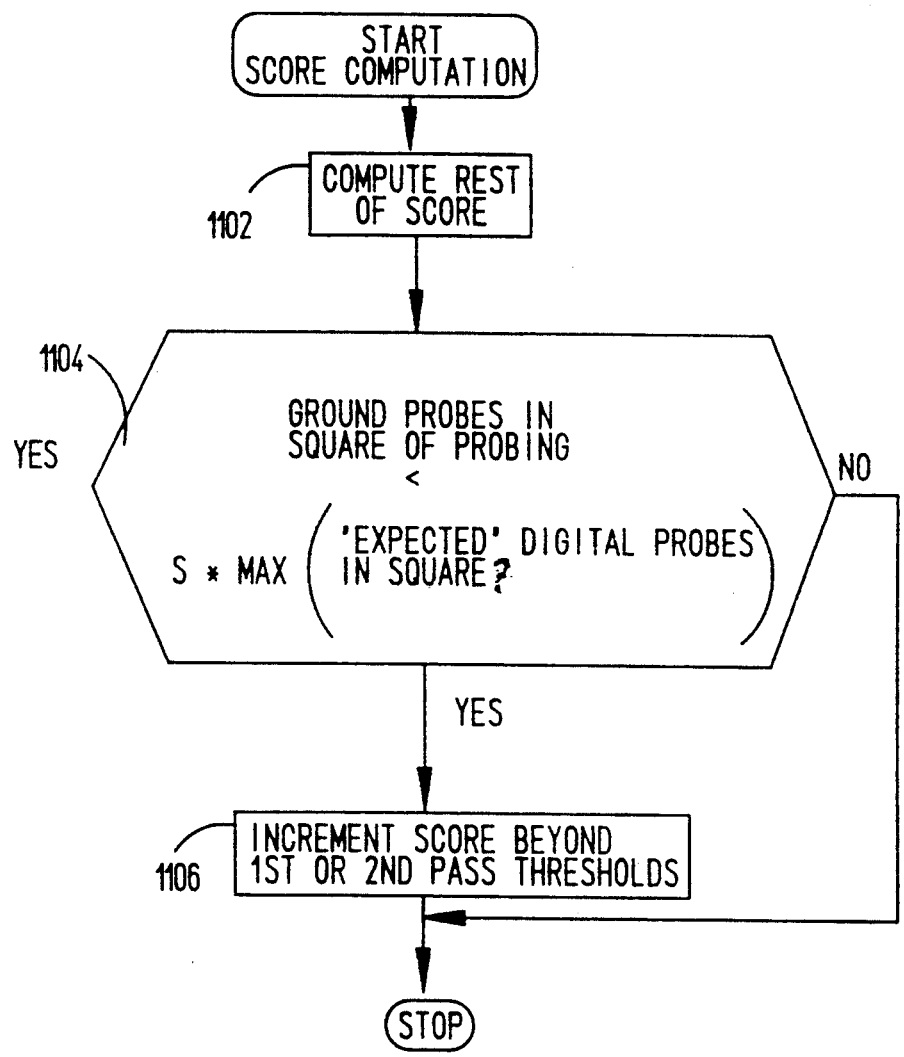
FIG. 11 shows a flowchart for computing scores pertaining to potential ground probe locations.

FIG. 11 illustrates a flowchart 1100 pertaining to score computation as specified in the flowchart block 1008 of FIG. 10. With reference to FIG. 11, at a flowchart block 1102, the score for the particular ground probing location is computed just as in the existing Probe Select program, as described hereinbefore. Recall that the score for a ground probing location is increased for every time that the modified or existing Probe Select program discovers something about the probing location that is less than optimal. In other words, ground probing locations with low scores make better choices for ground probes.

The remainder of the flowchart 1100 is considered by the inventors to be a feature of the present invention. After the score computation, the methodology performs a novel determination, as indicated in a flowchart block 1104.

At the flowchart block 1104, it is determined whether the ground probing locations in a grid square associated with the probing location is less than a fourth threshold, which pertains to the test signal probes. In accordance with the present invention, the fourth threshold is defined and computed as follows:

forth threshold = 5 * max (expected test signal probes in square, test signal probes in square)

wherein:

expected signal probes = $\Sigma\, p(i)$ $$p(i) = \begin{array}{c}\text{probability of}\\ \text{test signal probe}\\ \text{being placed at node}(i)\end{array} = \frac{\text{number of test signal probes required for node }(i)}{\text{number of test signal probes already on node }(i)}$$

The "expected" number of test signal probing locations and the actual count of test signal probing locations are both used. There is no way to guarantee that all test signal probing locations have been selected at the time the ground probing locations are selected, so the "expected" number of test signal probing locations is used as an estimate of how many test signal probing locations will be accorded to each imaginary grid square. If during the time that the ground probing locations are selected, the particular grid square already has more test signal probing locations in it than predicted by the "expected" count, the actual number becomes a better predictor of the number of test signal probing locations that will end up in the imaginary grid square.

If the number of ground probes is less than the fourth threshold, then the methodology envisions stopping and returning to the flowchart block 1006 of FIG. 10. Alternatively, if the number of ground probes is less than the fourth threshold, then the methodology envisions proceeding to a flowchart block 1106.

At the flowchart block 1106, the score is incremented beyond the first and second score thresholds. In other words, the amount of increase in the score is such that the overall score of the ground probing location is guaranteed to be above both of the first and the second score thresholds pertaining to the first or second passes, respectively, of ground probe selection flowchart 1000 specified in FIG. 10. The result is that such a ground probing location would only be used for a ground probe pursuant to the methodology if the methodology gets to the final third pass of ground probe selection flowchart 1000 without having selected the required number of ground probing locations.

III. Assigning The Location Of Interface And Personality Pins

As shown in FIG. 6, spring-loaded interface pins projected from pin cards 615, 617, 619 are in line with and contact the personality pins. The pin cards 615, 617, 619 are available in a number of varieties. Each type of pin card has a unique spatial orientation of interface pins. Furthermore, the pin cards 615, 617, 619 are in communication with the board test system.

An existing software program called "Module Pin Assignment" (MPA), which has been designed and commercially distributed by the Hewlett-Packard Company, Inc., Loveland, Colo., USA, assigns test signal probes to particular interface pins, and consequently, to particular personality pins, based upon certain prespecified criteria. The assignment of interface pins can be thought of as the assignment of personality pins because the pins are directly in line with each other. The operation of the existing MPA program as well as the criteria considered during operation of the MPA program are set forth in the 12-volume publication entitled, *HP 3070 Board Test System, User's Documentation Set*, HP Part No. 44930A (1989), which is incorporated herein by reference.

In accordance with the present invention, a modified MPA program is envisioned. The modified MPA program uses a different set of criteria for assigning test signal interface/personality pins in order to better control ground bounce.

Figure 12:
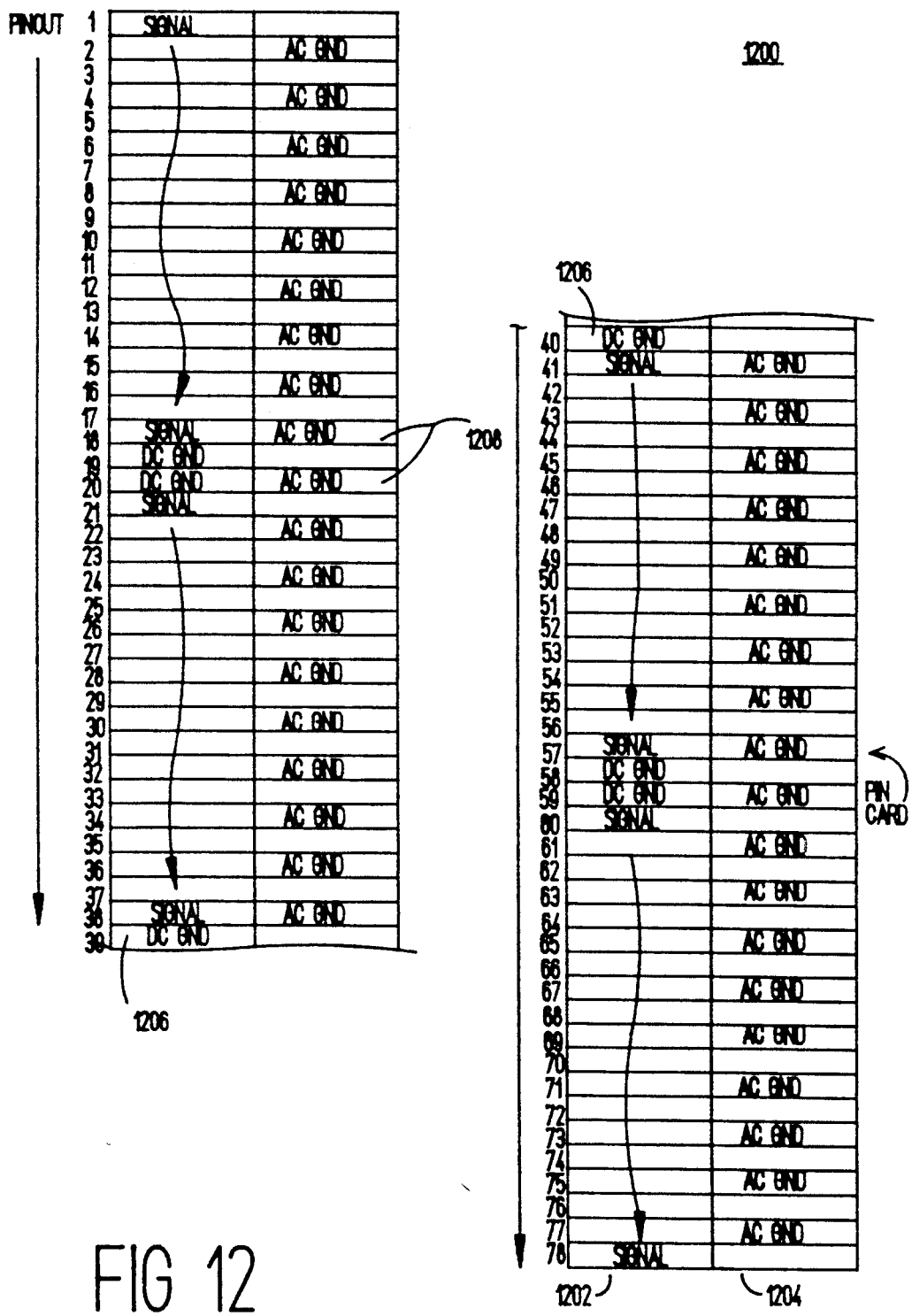
FIG. 12 illustrates the pinouts of a pin card.

FIG. 12 illustrates the pinouts of a pin card 615, 617, 619. As shown, both "DC" and "AC" grounds reside on each pin card 615, 617, 619. Prior to the present invention, the DC grounds already existed on the pin cards 615, 617, 619. In accordance with the present invention, the AC grounds were added in order to further control ground bounce. Generally, there is not much difference between the DC and AC grounds. Ideally, the grounds are at the same electrical potential. Note that the DC grounds are within the row containing the signals, whereas the AC grounds are in a separate adjacent row. The AC grounds are not positioned at every pinout, but are staggered as shown. Essentially, either the modified MPA program assigns critical test signals to the various pinouts situated on the pin cards 615, 617, 619.

Before assigning the interface/personality pins, the signal and ground probes must have already been assigned. The assignment of test signal and ground probes was discussed previously in this document in a Section 11 entitled "Assigning the Location of Test Signal and Ground Probes." In the preferred embodiment, either the existing or modified Probe Select program is utilized to assign test signal and ground probes. Furthermore, if a test signal probe pin is situated directly over the location of an interface pin, then a personality pin cannot be placed in that location to carry the signal to the pin card 615, 617, 619. The interface/personality pin in this location is called a "blocked" pin, because a test signal cannot be connected to it. With reference to FIG. 6, a blocked pin is shown at reference numeral 635.

The criteria for assigning interface/personality pins in accordance with the present invention are as follows:

1. Assignment of Critical Test signals a. A critical test signal assignment must be made within three pins of a DC ground pin which is not blocked. The closer the pin is to an unblocked DC ground pin the more desirable. For example, with reference to FIG. 12, a critical test signal associated with DC ground pin 19 could be assigned to one of pins 16, 17, or 18. If DC ground pin 20 is blocked, a critical test signal associated with DC ground pin 19 could also be assigned to either pin 21 or 22.

b. Within a given test, no more than one critical test signal may be associated with each non-blocked DC ground pin. Each DC ground pin can be associated with up to three (in rare cases 5) critical test signals; however, only one of them can be active at a particular time within the same test.

c. No other signals may be assigned within four pins of a critical test signal assignment within the instant test. This buffer zone protects the critical test signal from crosstalk.

2. Ground Status a. No more than fifteen AC ground pins on a pin card 615, 617, 619 may be blocked.

b. No more than two adjacent AC grounds may be blocked on a pin card 615, 617, 619. For example, with reference to FIG. 12, if the AC ground pin 14 is blocked, then it is acceptable for either AC ground pin 12 or AC ground pin 16 to be blocked, but not both.

In the event that the above criteria cannot be met, the pin card 615, 617, 619 cannot be used for assignment of any resources involved in a test which includes a declared critical test signal.

Figure 13:
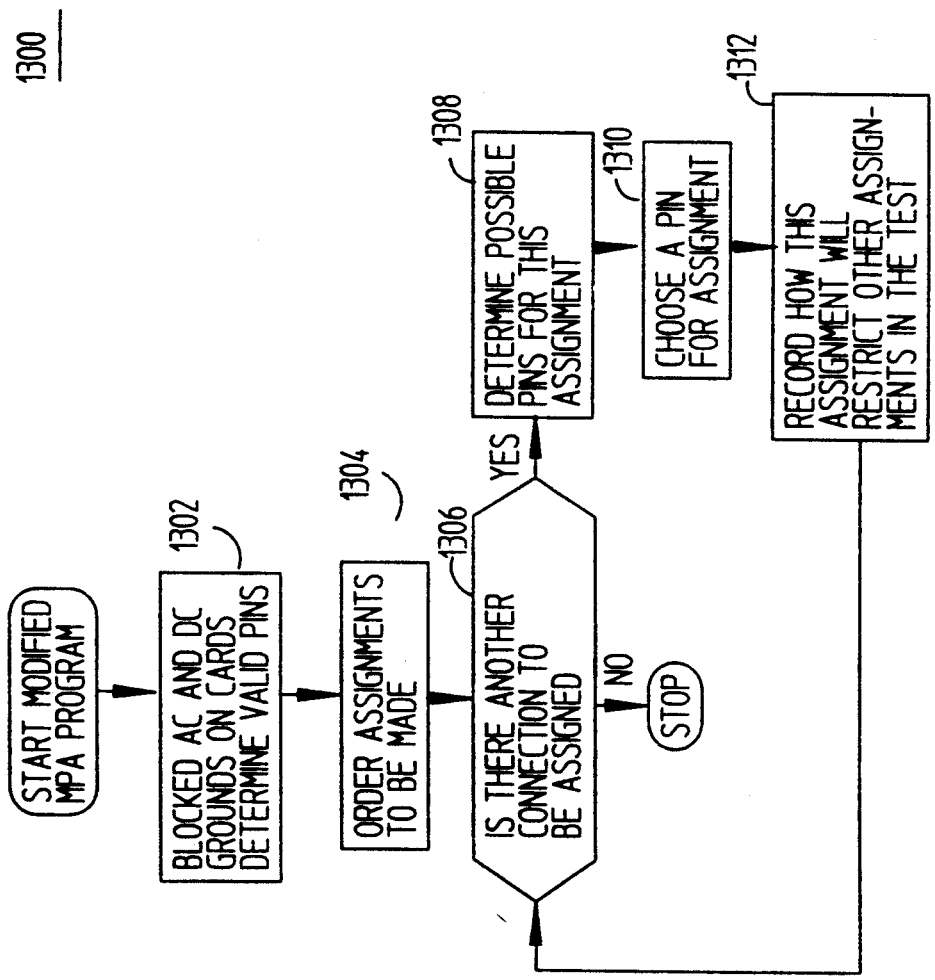
FIG. 13 shows a high level flowchart of the present invention wherein critical signal paths are spatially oriented below the internal ground plane of FIG. 6.

The preferred embodiment of the present invention will now be described with respect to FIGS. 13-15. FIG. 13 illustrates a high level flowchart 1300 for implementing the present invention. First, at a flowchart block 1302, it is determined which AC and DC grounds are blocked on the particular pin card at issue. From the blocked ground pins, the valid test signal pins are determined pursuant to the above criteria. A methodology within flowchart block 1302 is more specifically discussed below with respect to FIG. 14.

Figure 14:
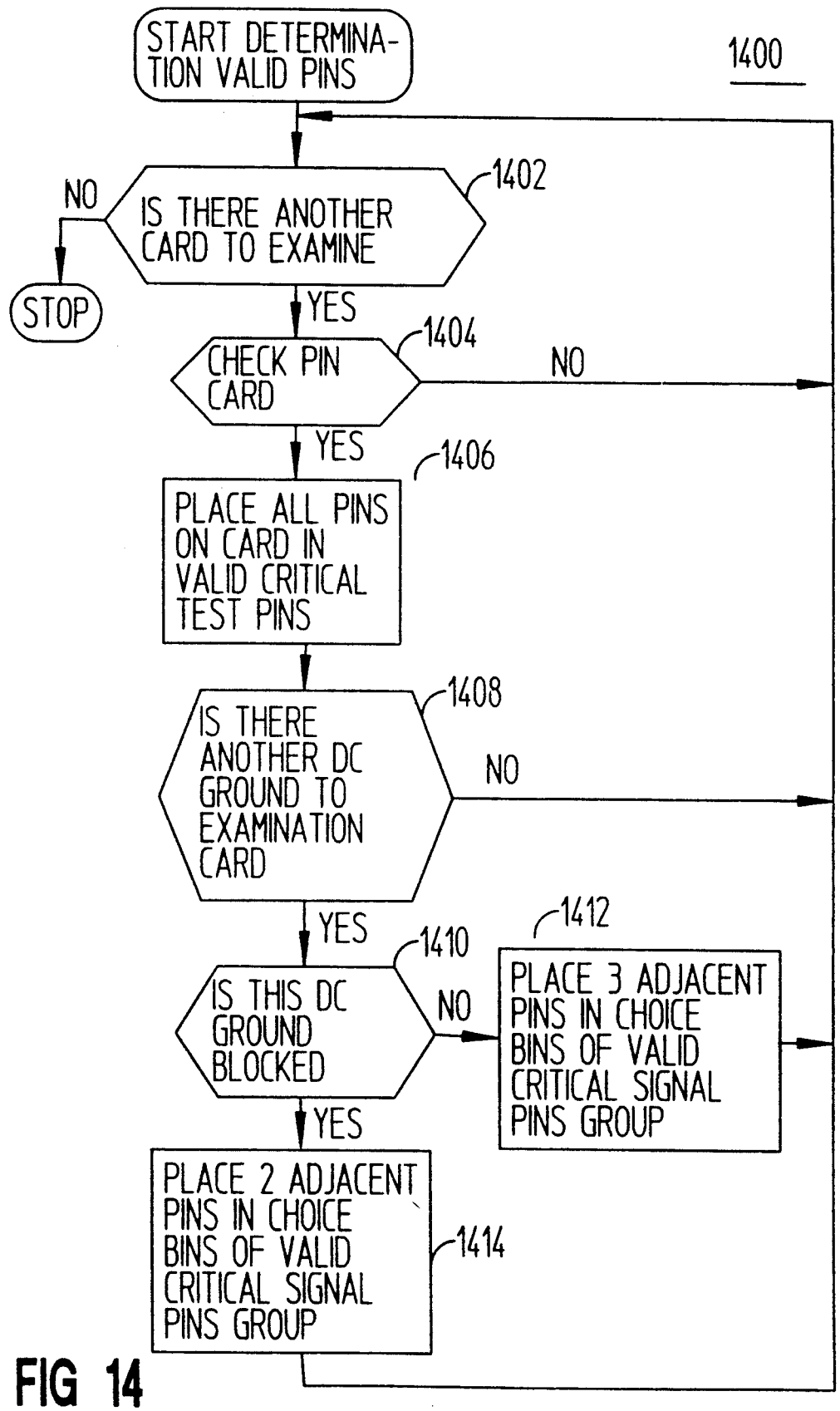
FIG. 14 illustrates a flowchart for determining blocked ground pins on the pin card of FIG. 12, in accordance with the present invention.

With reference to FIG. 14, blocked ground pins as well as valid test signal pins are determined as follows. First, at a flowchart block 1402, it is determined whether another pin card exists for examination. If one exists, then the flowchart 1400 proceeds to flowchart block 1404, where an initial check is made to determine if the pin card can be used at all. More specifically, if greater than 15 AC ground pins are blocked or if more than two consecutive AC ground pins are blocked, then the pin card cannot be used. If, however, the pin card is satisfactory, the methodology envisions proceeding to the flowchart block 1406. At the flowchart block 1406, all pins on the pin card are placed in a valid critical test pins group.

At a flowchart block 1408, a determination is made as to whether any DC grounds remain to be considered on the pin card 615, 617, 619. If so, then it is determined whether the DC ground is blocked, as indicated in a flowchart block 1410. If the DC ground pin is not blocked, then the three pins adjacent to the DC ground pin are placed in a "valid critical signal pins group." More specifically, the first pin adjacent to the DC ground pin is placed into a "choice bin 1" within the valid critical signal pins group. The second pin away from the DC ground pin is placed in a "choice bin 2", also within the valid critical signal pins group. Moreover, the third pin away from the DC ground pin is placed in a "choice bin 3", within the valid critical signal pins group.

In the alternative, when the DC ground pin is blocked, then the signal pin immediately adjacent to the blocked DC ground pin is placed within the choice bin 2 of the valid critical signal pins group. Moreover, the signal pin located two pins from the blocked DC ground pin is placed within the choice bin 3 of the valid critical signal pins group.

Thus, after completion of the methodology indicated in flowchart 1400 of FIG. 14, the valid test signal pins are identified at this point. Next, referring back to flowchart 1300 of FIG. 13, the methodology envisions assigning the interface/personality pins, indicated in a flowchart block 1304 to the valid test signal pins.

At a flowchart block 1306, a determination is made as to whether any electrical nodes on the circuit board 202 remain to be assigned. The nodes are involved in a test which includes declared critical signals. If none remain, then the modified MPA program terminates, as shown. However, if any electrical nodes remain to be assigned, then the methodology envisions cycling through the loop comprising flowchart blocks 1308, 1310, and 1312.

At the flowchart block 1308, the "possible pins" for the instant assignment are determined. The methodology indicated within the flowchart block 1308 is further specified in detail with respect to FIG. 15 hereafter.

Figure 15:
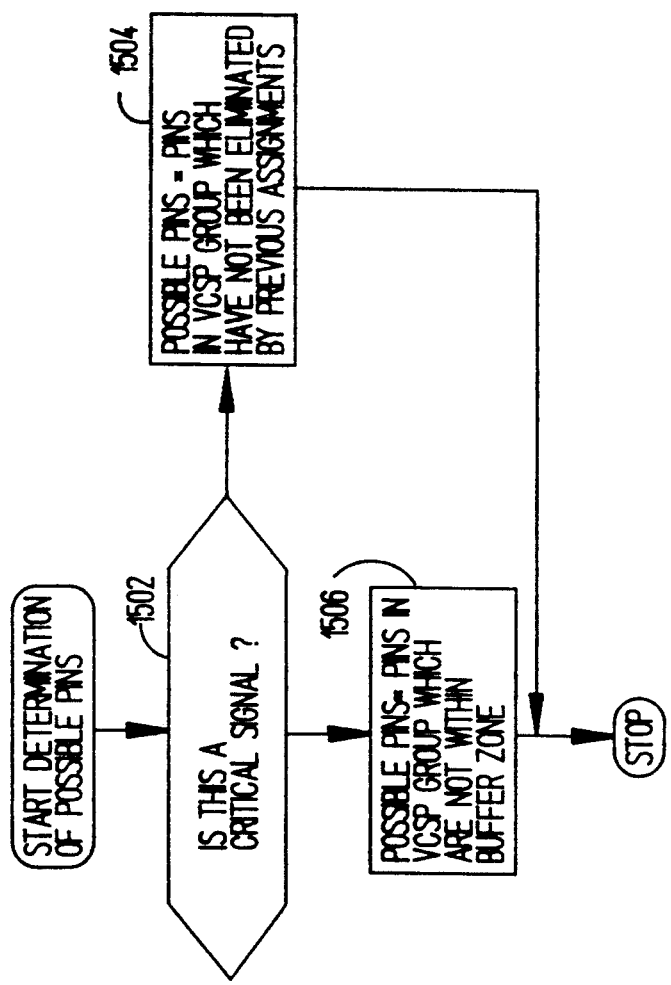
FIG. 15 shows a flowchart for determining the possible pins for an assignment of a critical test signal based upon the criteria in accordance with the present invention.

With reference to a flowchart block 1502 of FIG. 15, it is first determined whether the signal to be assigned is a critical test signal. If the signal to be assigned is not critical, then the possible pins for the signal at issue are identified as any of those pins in the valid critical test signal pins group which are not located in the buffer zone of previously assigned critical test signals. If the signal is a critical test signal, then the methodology proceeds to flowchart block 1506. At the flowchart block 1506, the possible pins for the signal at issue are identified. The possible pins in this case are those pins in the valid critical signal pins group which have not been eliminated by previous assignments in this test.

Next, with reference to a flowchart block 1310 of FIG. 13, a particular interface/personality pin is assigned. The methodology indicated in flowchart block 1310 is further specified with respect to FIG. 16.

Figure 16:
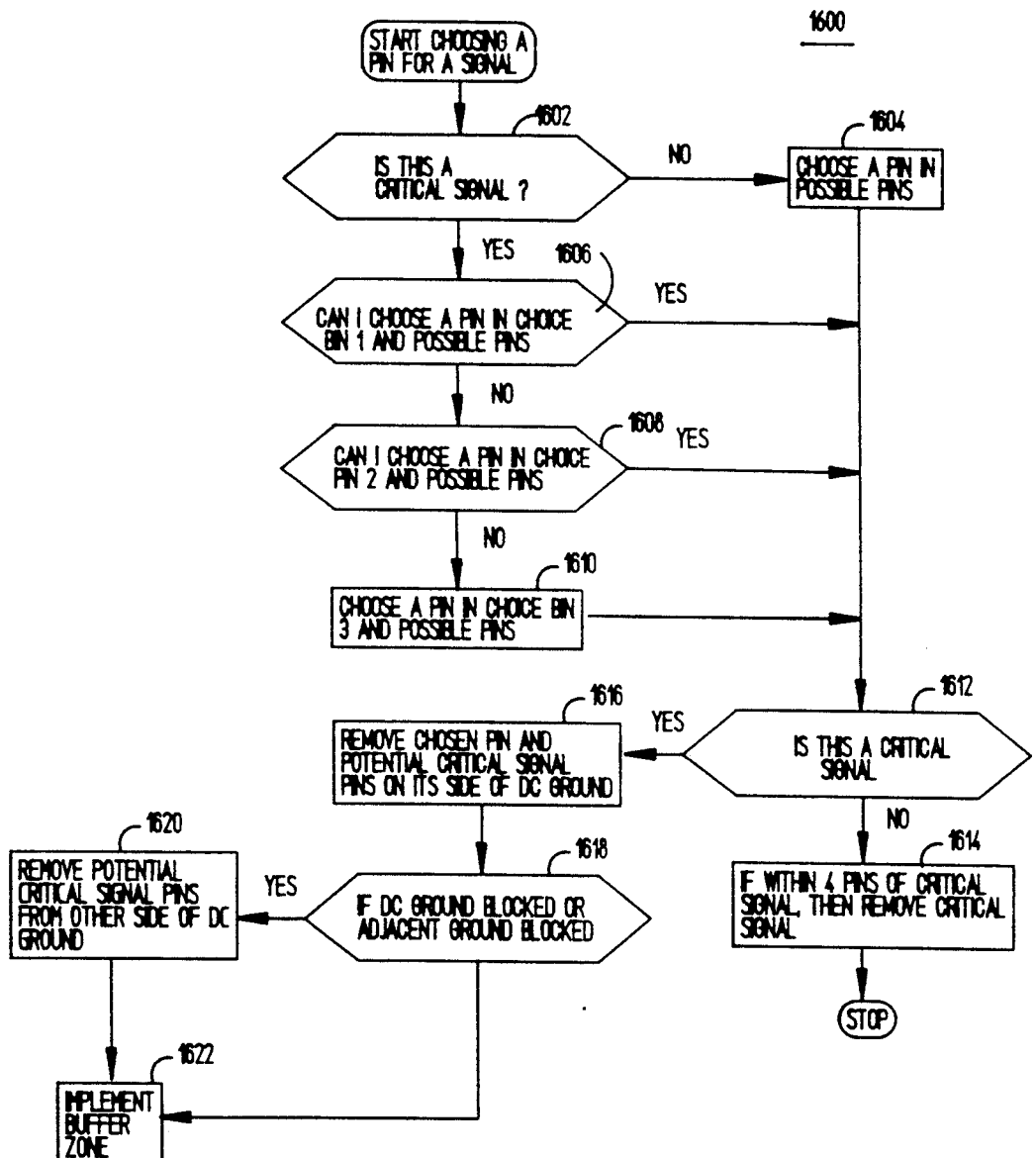
FIG. 16 illustrates a flowchart for assigning a critical test signal pin on the pin card of FIG. 12.

With reference to FIG. 16, a pin is chosen for assignment as follows. First, at a flowchart block 1602, a determination is made as to whether the signal on the pin is a critical signal. If the signal is not a critical test signal, then a pin from the possible pins bin is allocated. Alternatively, if the signal is a critical test signal, then a pin is chosen which is in the choice bin 1 and which is also in the possible pins bin, as indicated in the flowchart block 1606. If no pin is available, then a pin is chosen which is in choice bin 2 and which is also in the possible pins bin, as indicated in the flowchart block 1608. Finally, if no pin is available, then a pin is chosen which is in choice bin 3 and which is also in the possible pins bin, as indicated in the flowchart block 1610.

After a signal has been assigned to a pin, the methodology proceeds to a flowchart block 1312 of FIG. 13. Here, a record is made to implement the buffer zone. In other words, a record is made to restrict other pin assignments in the instant test.

FIG. 16 illustrates how pin assignments restrict other later assignments in subsequent tests. Referring to FIG. 16, at a flowchart block 1612, it is first determined whether the signal is a critical test signal.

If the signal is not a critical test signal, then the flowchart proceeds to a flowchart box 1614. At the flowchart block 1614, it is first determined whether the chosen pin is within four pins on the pin card of a potential critical test signal pin (i.e., within three pins of a DC ground pin on the pin card). If the chosen pin is within four pins, then the affected potential critical test signal pins are removed from consideration in the test. For example, if the pin of configuration were "CPP321G", where G = closest DC ground, P = pin on pin card, C = pin chosen for assignment, and numbers indicate possible critical signal pins, then pins 3 and 2 are removed from consideration as possible critical signal pins in the present test.

Alternatively, at the flowchart block 1612, the methodology envisions proceeding to a flowchart block 1616. At the flowchart block 1616, the chosen pin and the potential critical signal pins on its side of the DC ground on the pin card are removed from consideration for this test. For example, if the pin configuration were "321G", where G = DC ground, then pins 1, 2 and 3 are removed from consideration as possible critical signal pins.

Next, at a flowchart block 1618, a determination is made as to whether the DC ground is blocked or the adjacent DC ground is blocked. If either ground is blocked, then the potential critical signal pins from the other side of the blocked DC ground are removed from consideration for the instant test. For example, if the configuration of the pins is "GB123", where G=DC ground and B=blocked DC ground, then pins 1, 2, and 3 would be removed from consideration.

As indicated in the flowchart block 1622, the buffer zone is implemented. Specifically, four pins beyond the chosen pin are removed from consideration for other connections in the instant test. For example, if the pin configuration were "RRRRCRG", where G=closest DC ground and C=chosen pin for assignment, then R is the pin to be removed from consideration.

Finally, the flowchart 1300 returns to the flowchart block 1306, where another signal connection is retrieved, if any remain to be assigned.

The preferred embodiment was chosen and described in order to best explain the principles of the present invention and its practical application to those persons skilled in the art and to thereby enable those persons skilled in the art to best utilize the present invention in various embodiments and with various modifications as are suited to the particular use contemplated. It is intended that the scope of the present invention be broadly defined by the following claims.

We claim:

1. A method for positioning test signal pins in a shortwire board test fixture for interfacing a circuit board to a test board system during a test to efficiently control ground bounce, wherein said test signal pins connect a ground plane in the board test fixture to a pin card interfaced to the board test system, an the pin card includes a first column of at least four test signal pins and at least two first ground pins and a second column including at least fifteen second ground pins, the method comprising the steps of:

selecting a predetermined number of active second ground pins, wherein no more than fifteen of said second ground pins are inactive and no more than two consecutive second ground pins are inactive;

connecting said predetermined number of active second ground pins to the circuit board;

selecting all critical test signals to be located within three pins of an exclusive first ground pin, wherein said critical test signals are susceptible to causing ground bounce; and connecting all critical test signals to pins located within three pins of said exclusive first ground pin.

2. The method of claim 1, further comprising the step of:

selecting all test signals to be at least four pins away from any critical test signals in the test of the circuit board; and connecting all test signals to pins located at least four pins away from any critical test signals in said test.

* * * * *